United States Patent [19]

Becker et al.

[11] 4,424,580

[45] Jan. 3, 1984

[54] METHOD AND APPARATUS FOR GENERATING ELECTRON SPIN REVERSAL IN FERRIMAGNETIC MATERIAL

[75] Inventors: Carl H. Becker, Mountain View; Werner J. Christmann, Los Altos, both of Calif.

[73] Assignee: Precision Echo, Santa Clara, Calif.

[21] Appl. No.: 260,963

[22] Filed: May 6, 1981

[51] Int. Cl.$^3$ ................. G11C 13/04; G11C 13/06
[52] U.S. Cl. ................................. 365/121; 365/122; 369/110; 350/DIG. 1
[58] Field of Search ............. 365/121, 122, 127; 369/110, 275; 350/370, 353, DIG. 1

[56] References Cited

U.S. PATENT DOCUMENTS

| | | | |
|---|---|---|---|
| 3,228,015 | 1/1966 | Miyata et al. | 365/122 |
| 3,624,622 | 11/1971 | Chen | 365/122 |
| 3,701,133 | 10/1972 | Smaller et al. | 365/122 |

OTHER PUBLICATIONS

Porter et al., "Transparent Ferromagnetic Light Modulator Using Yttrium Iron Garnet," Journal of Appl. Phys., vol. 29, No. 3, 3/58, pp. 495–496.
Krumme et al., "New Magnetor-Optic Memory Concept Based on Compensation Wall Domains," Appl. Phys. Lett., vol. 23, No 10, 11/15/73, pp. 576–578, S4315 0026.
Kurtzig et al., "Reorientation and Curie Point Writing in Orthoferrites," Journal of Applied Physics, vol. 42, No. 4, 3/15/71, pp. 1804–1805, S1510 0033.
Dillon, "Optical Properties of Several Ferrimagnetic Garnets, Journal of Applied Physics, vol. 29, No. 3, 3/58, pp. 539–541.
Ahn, "Induced Anisotropy in Magneto-Optic Films," IBM Tech. Disc. Bul., vol. 11, No. 3, 8/68, pp. 326–327.

Primary Examiner—Stuart N. Hecker
Attorney, Agent, or Firm—Townsend & Townsend

[57] ABSTRACT

Methods and apparatus for reversibly altering magnetic characteristics or domains of ferrimagnetic material by photomagnetic means, particularly by electron spin reversal (spin-flip). Photomagnetic electron spin reversal and inversion creating cylinder domains and their surrounding toroid domains of oppositely directed intrinsic magnetization in ferrimagnetic thin film material are achieved by means of signal modulated circularly polarized laser radiation. Three different stable conditions are detectable. The invention has particular application as a fundamentally new aproach to erasable digital data storage, providing means and methods for photomagnetically alterable and erasable data storage which can be detected by observing polarization of optical radiation directed through the ferrimagnetic material.

39 Claims, 4 Drawing Figures

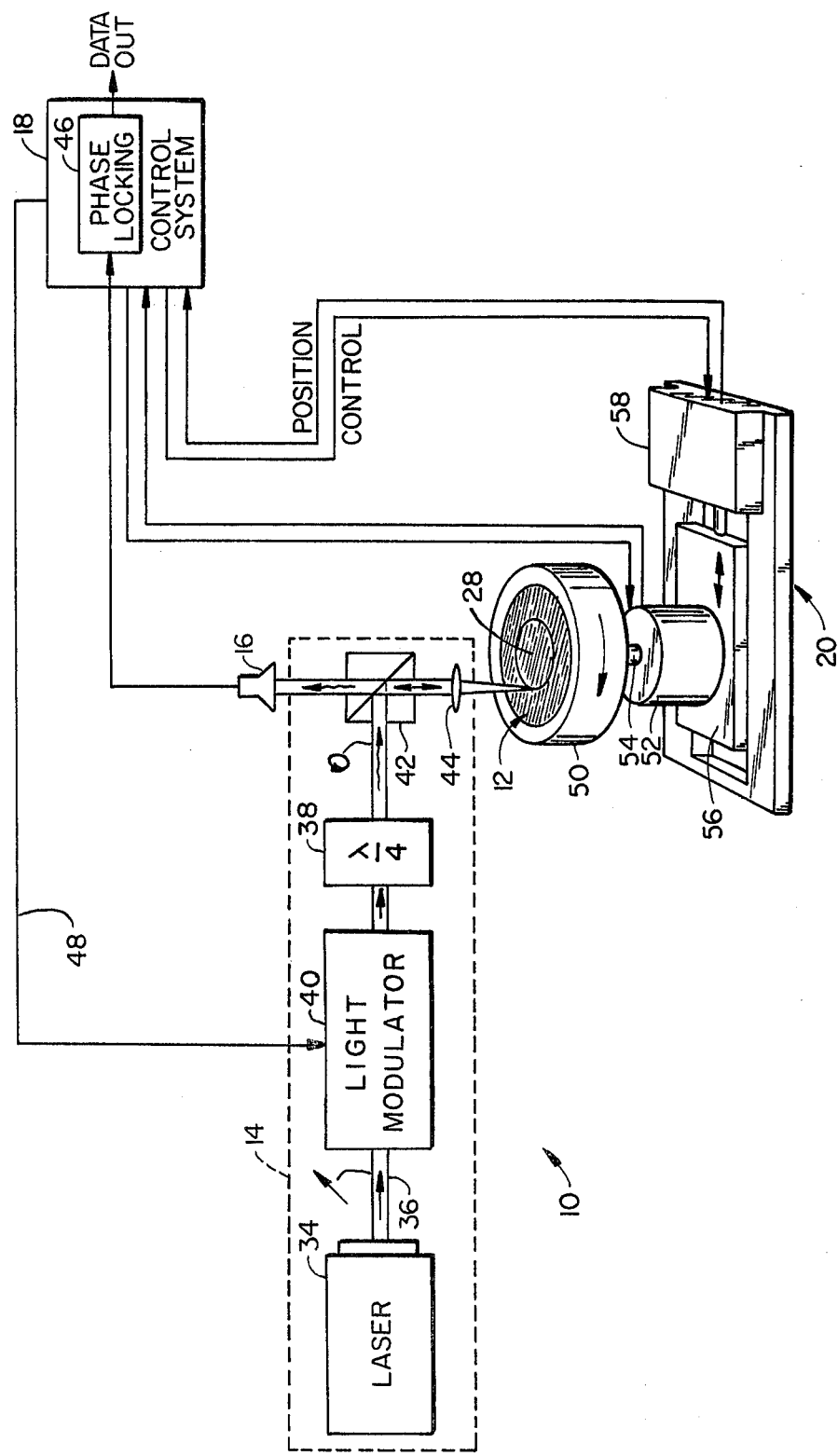
FIG._1.

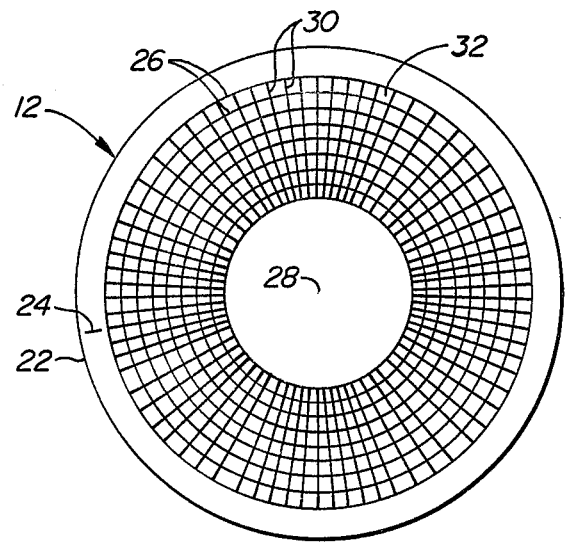
FIG._2.
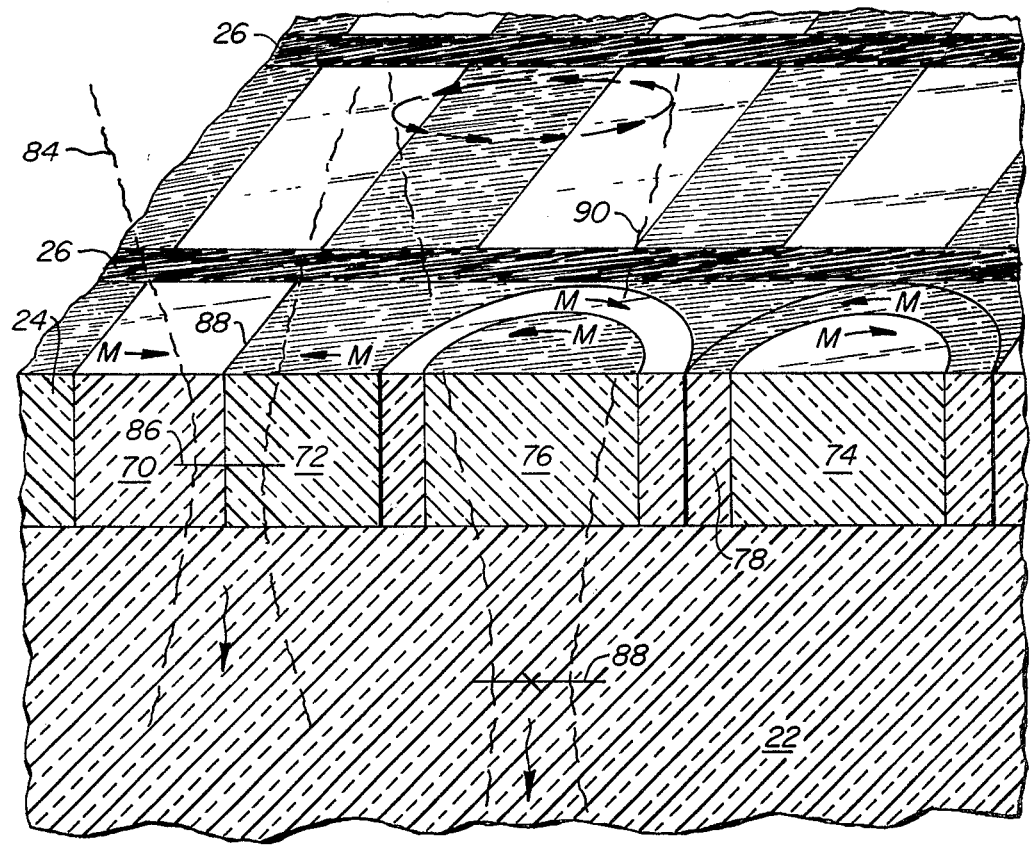
FIG._4.

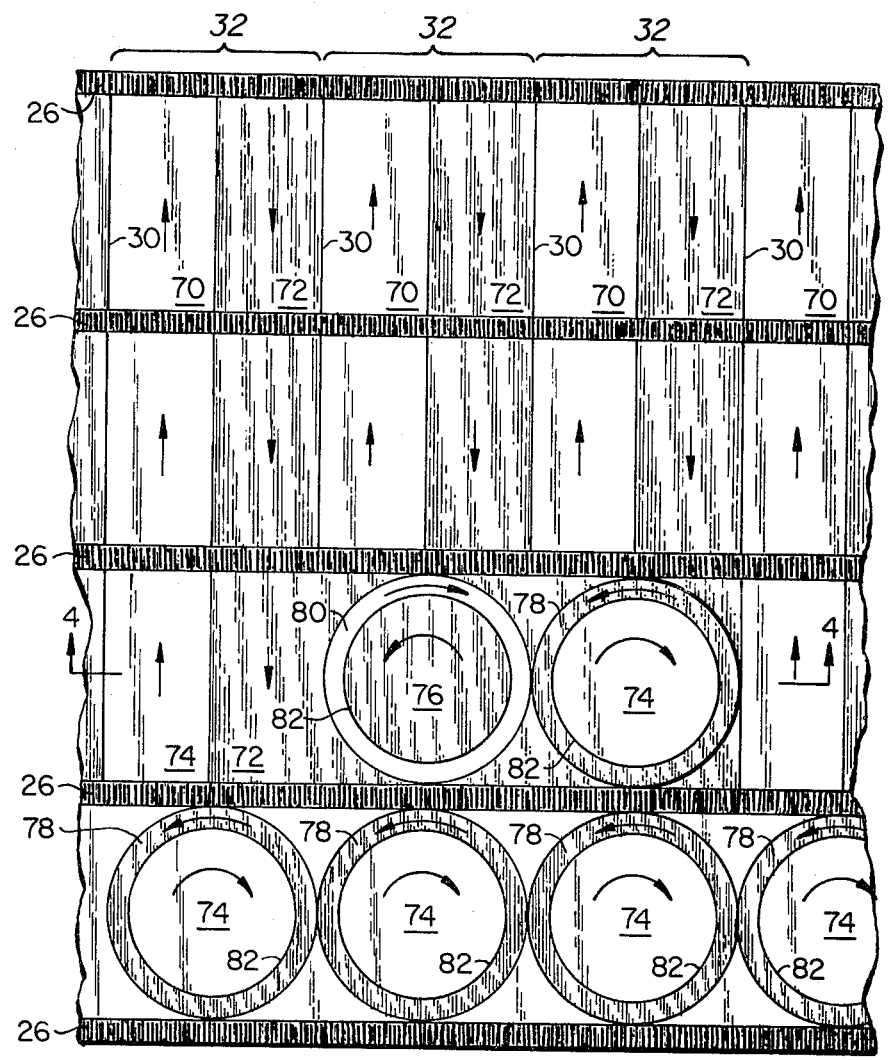
FIG._3.

METHOD AND APPARATUS FOR GENERATING ELECTRON SPIN REVERSAL IN FERRIMAGNETIC MATERIAL

BACKGROUND OF THE INVENTION

1. Field of Invention

This invention relates to methods and apparatus for altering light polarization characteristics of domains of magnetic materials, and more particularly it relates to invertible photomagnetic and thermomagnetic electron spin reversal (spin-flip) in ferrimagnetic thin film materials. The principle underlying this invention is analogous to the principle of nuclear spin resonance.

The invention has particular and immediate application as a fundamentally new approach to digital data storage. The invention provides for alterable and erasable data storage by means of interaction of the angular momentum of light (polarization) and the angular momentum possessed of certain magnetic materials, particularly ferrimagnetic materials (magnetization). The invention employs thin, substantially optically transparent garnet disks of the type utilized for magnetic bubble memory devices as the storage medium. However, the invention does not make use of a steady state magnetic field as in bubble memory devices.

2. Description of the Prior Art

Heretofore it has been generally accepted and taught that it is not possible to drive a magnetic spin system, particularly a ferromagnetic spin system, sufficiently hard to reduce the magnetization $M_z$ of a domain to zero or even to reverse the magnetization $M_z$. For example, Charles Kittel in his widely-recognized basic text *Introduction to Solid State Physics*, Fifth Edition (1975) page 517, teaches that it is impossible to neutralize or to reverse magnetization because ferromagnetic resonance excitation breaks down into spin wave modes before the magnetization vector can be rotated appreciably from its initial direction. The same condition is generally held to be true for ferrimagnetic materials.

This invention is therefore based on a heretofore unrecognized and unobserved phenomenon, namely, reversible electron spin orientation absent irreversible destruction to the medium.

A general understanding of the theory in the prior art of this invention may be obtained by reference to the following works:

W. Heitler, *Quantum Theory of Radiation*, (Oxford, 1954), pp. 401–404. This work presents a theory of angular momentum.

L. Néel et al., "The Rare Earth Garnets", *Progress in Low Temperature Physics*, editor Gorter, (North Holland, 1964), pp. 66–67. Néel teaches the basic theory of ferrimagnetism.

A. R. Edmonds, *Angular Momentum in Quantum Mechanics*, (Princeton, 1974), p. 32. This work teaches the law of addition of quantum mechanics.

E. Merzbacher, *Quantum Mechanics*, (Wiley, 1970), pp. 251–193. This work presents a discussion of electron spin in general and the spin dynamics of a two-level system.

A. Sommerfeld, *Optics*, (Academic Press, 1949), pp. 179–272; 318–324. This presents the basic description of the diffraction field near focal points.

M. Born and E. Wolf, *Principles of Optics*, (Permagon Press, 1980), pp. 370–555, particularly at p. 440. This is a description of the theory of optics and includes a depiction of the three-dimensional diffraction pattern in the neighborhood of the focal point.

A. P. French and E. F. Taylor, *Quantum Physics*, (Norton, 1978), pp. 261–265. This work presents a discussion of electromagnetic polarization.

With respect to optical memory systems, the prior art has been characterized by laser mass memory systems having permanent registration of digital information in the form of bits formed by destruction of the medium. In particular, lasers have been employed to burn diffraction-limited "holes" within laser focus in low melting point thin metal films in order to provide archival storage. Examples of such systems are disclosed in various patents of which the present inventor is an inventor or co-inventor:

U.S. Pat. No. 3,314,073, Apr. 11, 1967, LASER RECORDER WITH VAPORIZABLE FILM;

U.S. Pat. No. 3,474,457, Oct. 21, 1969, LASER RECORDING APPARATUS;

U.S. Pat. No. 3,654,624, Apr. 4, 1972, LASER RECORDING SYSTEM USING DRUM MOUNTED RECORDED STRIPS;

U.S. Pat. No. 3,665,483, May 23, 1972, LASER RECORDING MEDIUM.

Attempts have been made without success to achieve photomagnetic inversion in ferrimagnetic materials. Report of one such attempt in the paper of the present inventor entitled "Photomagnetic Storage in a Ferrimagnetic Material", published in 1971 in *Journal de Physique*, Vol. 32, pp. Cl-117, 118. A suitable memory readout system is described in a paper of the present inventor entitled "Archival Laser Disk Mass Memories", LASER-79 Conference, published in its proceedings, Orlando, Fla., December 1979.

SUMMARY OF THE INVENTION

According to the invention, nondestructive and repeatable change in the optical transmission characteristics of polarized light through ferrimagnetic material is achieved by transiently exposing ferrimagnetic thin film with circularly polarized optical radiation of a power intensity and duration sufficient to induce an observable change in the transmission of polarized light but not sufficient to cause irreversible change or damage to the ferrimagnetic material. Specifically, one particular mechanism is believed to be a quantum-mechanical photomagnetic electron spin reversal in the domains of thin film ferrimagnetic material which is achieved by directing focused circularly polarized light transiently through ferrimagnetic film. The film is of the type used for magnetic bubble devices. The process generates cylinder domains and surrounding toroidal or shell domains having an intrinsic magnetization induced by the circular polarization of the incident radiation. The material acted upon according to the invention can be neutralized to its original stable state or, significantly, inverted to an opposite stable state identifiable by cylinder domains of opposite light polarization.

In a specific embodiment the photomagnetic electron spin effect is achieved by transiently irradiating a YIG ferrimagnetic thin film of a thickness approximately equal to the natural domain width of the film with circularly polarized laser light at 0.488 micrometers focused to its diffraction limit adjacent the surface of the film. Specifically, the film is oriented between the focal plane of the light and the negative phase space of optical diffraction. The phase space is determined by the phase jump of magnitude pi, which occurs in passing through the geometrical focal point of the diffraction ellipsoid in the direction of the propagation of the optical radiation.

Experimentally, it has been observed that the beam diameter must be on the order of the width of the magnetic domain and the beam power can and must be below the power which is observed to cause irreversible damage in the magnetic material.

The process has application to alterable and erasable data storage and retrieval systems employing ferrimagnetic thin film material as a storage medium. Up to three states may be written and detected in a unit memory cell by means of polarized light which is phase-locked to a selected polarization. A unit memory cell comprises a thin film of ferrimagnetic material having a width between parallel permanently registered boundaries on the order of the width of two natural domains, with stripe domains being oriented orthogonal to the permanent boundaries, the boundaries of the unit cell being defined at every other stripe domain boundary. Pairs of cylindrical and toroidal domains of either polarization can be induced in a unit cell by appropriate irradiation according to the invention.

In a memory system according to the invention, the medium is a disk of ferrimagnetic thin film yttrium iron garnet (YIG) on a substrate of gadolinium gallium garnet (GGG) formed in a disk with which may be permanently rings etched or burned with a laser beam in the disk at a spacing of approximately 4.25 micrometers (the film having a depth of 2.13 micrometers). The disk is mounted for rotation under control of a suitable control system.

One of the objects of this invention is the achievement of a genuinely reversible photomagnetic effect in ferrimagnetic material, particularly thin film material.

Another object of this invention is a reversible photomagnetic effect for use in a memory system which does not apply external magnetic fields, as is required of conventional magnetic bubble memory devices.

A still further object of this invention is a three-state unit memory cell which can be interpreted unambiguously as representing a +1, 0, and −1, depending upon the magnetization of the ferrimagnetic material in a unit cell of a thin film medium, the magnetization being observable by detecting the polarization of light directed through the medium.

A still further object of the invention is the provision of a photomagnetic mass storage device capable of writing at rates of up to about 500 megabits per second, or in other words at the angular precession frequency of the reverse spin system of the ferrimagnetic material.

A still further object of the invention is the provision of a photomagnetic mass storage device having a unit bit cell size of a smallest about 4 micrometers on a side, which is the size of twice the natural domain width of a ferrimagnetic thin film on the order of 2 micrometer thickness and which can react efficiently with circularly polarized laser radiation in the visible region. A photomagnetic mass storage device having a unit bit cell size on the order of 4 micrometers is able to attain a bit density on the order of 6 Mbits/cm$^2$ or more.

Another object of the invention is the provision of a photomagnetic disk storage medium comprising a substantially transparent ferrimagnetic garnet film on a substantially transparent garnet substrate.

A further object of the invention is the provision of a photomagnetic laser reading and writing system employing ferrimagnetic thin film materials as an alterable recording medium.

A still further object of the invention is the provision of a photomagnetic laser reading and writing system employing circularly polarized light for erasably registering and retrieving permanent digital information in a ferrimagnetic thin film material.

Other objects and the advantages of this invention will be apparent upon reference to the following detailed description taken in conjunction with the accompanying drawings.

BRIEF DESCRIPTION OF THE DRAWINGS

FIG. 1 is a block diagram of a laser reading and writing system according to the invention employing a medium according to the invention and the method of recording and altering data according to the invention.

FIG. 2 is a top plan view of a ferrimagnetic disk illustrating the orientation of memory cells according to the invention.

FIG. 3 is a top plan view of a photomicrograph of one segment illustrating several bit cells and various types of magnetic domains created according to the invention.

FIG. 4 is an isometric view of FIG. 3 with a cutaway cross-section of the medium along line 4—4 of FIG. 3 illustrating the three types of magnetic domains and the method of inducing electron spin orientation according to the invention.

DETAILED DESCRIPTION OF SPECIFIC EMBODIMENTS

Turning to FIG. 1, there is shown a laser mass memory system 10 according to the invention. The memory system 10 comprises a ferrimagnetic medium 12, a source of circularly polarized optical radiation 14, an optical detector 16, a control system 18 and a servo positioning system 20.

Turning to FIG. 2, the medium comprises a disk, typically a gadolinium gallium garnet (GGG) substrate 22 which is preferably optically flat on which is grown a film of yttrium iron garnet (YIG) 24. The YIG is grown to a thickness of approximately 2.13 micrometers. Scribed in the thin film may be permanent boundaries 26 consisting of concentric circles about the central axis 28 of the disk. The boundaries may be etched, deposited or laser burned at intervals equal to about twice the depth of the film, or about 4.26 micrometers. The virgin domains of the film, i.e., the random strip domains, are reoriented as parallel stripe domains and may be arranged radially in orthogonal relation to the boundaries 26. The stripe domains are arranged in pairs of naturally occurring alternating magnetization stripes with a spacing of approximately 4.26 micrometers between like domain transitions 30. Like domain transitions 30 are represented schematically as radial lines on the disk medium 12. Each unit cell 32 may be bounded by two like domain transitions 30 and two permanent boundaries 26, as hereinafter explained.

A suitable medium is provided by Allied Chemical Corporation, Specialty Products Division, Charlotte, N.C., under the brand name GALAX GGG Magnetic Bubble Substrate.

Referring again to FIG. 1, the radiation source comprises a laser, typically an Argon II-ionic laser 34 tuned to 0.488 micrometers and providing as an output a linearly polarized beam 36 to a light modulator 40 such as a Pockels cell. The output of the light modulator 40 is provided to a circular polarizer 38. The circular polarizer 38 is a Lambrecht quarter wave plate inserted in the beam. The output of the circular polarizer 38 is a circularly polarized beam. The output of the polarizer 38 is directed to a beam splitter 42 where the reflected beam is directed through a lens system 44 which focuses the circularly polarized beam to its diffraction limit adjacent the medium 12. Reflected light from the medium 12, is directed to a polarized light detector in the optical detector 16, which may include photodetectors (not shown) oriented to sense the presence or absence of transmitted light through the thin film 24 (FIG. 2) of the medium 12. The output of the detector 16 is directed to an appropriate electronic control system 18. The control system 18 preferably includes phase-locking circuitry 46, which is used for tracking the orthogonal transitions 30 defining the boundaries of the cells 32. When the medium 12 is used for two-state data storage, input data is provided in a form suitable for blocking and unblocking and circularly polarized light through a signal line 48 to the light modulator 40. Output data is read out of the control system 18 from the optical detector 16. The optical detector 16 may utilize a dual path Faraday effect for detecting light polarization due to the intrinsic magnetization of the thin film domains of the medium 12.

The servo positioning system 20 is operative to maintain the medium in motion relative to the incident radiation, and to this end is operative to rotate the disk medium 12 at relatively high speed on a platform 50 mounted on air bearings or the like (not shown). The platform 50 is driven by a rotary motor 52 connected thereto by a shaft 54. The motor 52 is mounted on a positioning table 56 which is operative to move the platform 50 radially through the center axis 28 of the medium 12, for example, by a linear positioning motor 58. The rotary motor 52 and the linear positioning motor 58 may be under control of the control system 18. The disk medium 12 is rotated to provide a disk scanning velocity $V_s$ to obtain desired bit rate. The bit rate is determined by dividing disk scanning velocity $V_s$ by the dual domain stripe width 2D. For example, with a dual domain stripe width of 2D equal to 4.26 micrometers, and a disk scanning velocity of $V_s$ equal to 50 meters per second, a bit rate $f_\omega$ on the order of 12 megabits per second is achievable. The ultimate limit of the bit rate is the precession frequency of the medium, which could give a bit rate on the order of 500 megabits per second for a single track.

Turning now to FIG. 3, the microstructure of the medium 12 is shown. Permanent boundaries 26 may separate tracks of bit cells 32. Like transitions 30 between dual stripe domains are identified by phase-lock to one or other of the dual stripe domains, which are readily recognized as alternately "white" (transmissive) and "black" (nontransmissive) orthogonal regions in the medium. In FIG. 3 upwardly pointing arrows identify first stripe domains 70 and downwardly pointing arrows identify second stripe domains 72. Stripe domains are oriented orthogonally to the boundaries 26.

Two types of cylindrical and toroidal shell domains obtain according to the invention. Right circularly polarized cylindrical domains 74 and left circularly polarized cylindrical domains 76 may subsist side-by-side between the boundaries 26 along a track. Each cylinder domain 74, 76 is surrounded by a shell or toroid domain 78, 80, namely, a left circularly polarized torodoidal domain 78 about a right circularly polarized cylinder domain 74 and a right circularly polarized toroid domain 80 about a left circularly polarized shell domain 76. Cylinders and toroids or shells are believed to be separated by a 180° Bloch wall 82. The volume of each cylinder and toroid domain pair is substantially equal.

Turning to FIG. 4, the three types of domain pairs are shown in cross-section. The stripe domain pairs 72, 74 are created by directing a diffraction-limited beam 84 with its focal plane 86 in the substrate 24 along an axis orthogonal to the permanent boundaries 26. The beam 84 generates a cut 88 or separation line between ferrimagnetic stripe domains 70, 72. The intrinsic magnetization of the adjacent stripe domains are of equal and opposite magnitude. Depending on the orientation of the beam 84 relative to preexisting domain structures, the stripe domain may either be shifted laterally or the original domain pattern may be reversed. The width of the laser cuts is on the order of the width of the diffraction-limited beam, typically on the order of 1 micrometer or less. The stripe domain is considered the initialized alignment pattern of a memory cell 32. It can represent a zero state in a digital format.

Electron spin reversal (i.e., the electron spin-flip condition) can be induced in any stripe domain pair to create electron spin orientation domains capable of inversion, namely, cylinder and toroid pairs. In FIG. 4, cylinder 76 is created by directing a circularly polarized diffraction-limited beam 90 through the thin film 24 with its focal plane 88 adjacent to, and generally in the substrate 22, of the ferrimagnetic material such that the radiation incident on the film is circularly polarized between the focal plane and the negative phase space of the circularly polarized beam 90. The polarized radiation is believed to induce a dynamic change in angular momentum of the intrinsic magnetization of the material. A beam of opposite circular polarization (not shown) may induce magnetization of an opposite sense in another adjacent cell, such as cylinder and toroid pair 74, 78.

When necessary laser power conditions are met and the required negative defocusing, as well as circular polarization of the incident beam is established, then a chain of photomagnetic cylinder domains and their associated toroid domains may be created by scanning the beam along the track between the permanent boundaries 26 of the medium 12. In order to do so, the ferrimagnetic domain structure and the angular velocity of the disk should be correlated to the relative phase of the domain structures within the track.

Thermomagnetic erasure of any structure may be achieved by directing the focused beam 84 with its focal plane 86 in the film to heat the film above the Curie temperature.

In accordance with the invention, there is provided a method for inducing in ferrimagnetic material an observable change in its transmission characteristics to polarized light. The change is apparently a domain change. The method comprises directing a first circularly polarized coherent optical radiation beam at a stripe domain of a ferrimagnetic film of a thickness on the order of twice the width of a natural domain of the film, the beam being of a diameter less than the width of a target domain, the beam being of a sufficient intensity to induce an electron beam orientation parallel to the circular polarization of the beam and the beam being directed through the film for an interval insufficient to cause irreversible damage in the magnetic film but sufficient to impart angular momentum to orient electron spin in the ferrimagnetic material in order to generate a cylinder domain encircled by a toroid domain of substantially equal volume and opposite polarization.

Further according to the invention, the beam is focused to its diffraction limit with the beam directed to intersect the film in a beam region between the diffraction-limited focal plane and a point of phase transition of pi of the beam. Further according to the method of the invention, the circularly polarized beam is directed at the film with the modulated intensity between zero and a peak which is less than 100 percent of the intensity sufficient to cause destruction of the film. The beam may be modulated by moving the beam relative to the film, as for example by rotating the disk at relatively high speed.

The method according to the invention further includes altering the magnetization of a selected cylinder domain by photomagnetically inducing an electron spin orientation with a circularly polarized radiation of a polarization opposing the current magnetization of the target cylinder domain.

The method according to the invention further includes altering the magnetization of the cylinder domain by thermomagnetically heating the cylinder domain to the Curie temperature of the material to change the magnetization from the cylinder domain to stripe domain. The method according to the invention for recovering the data includes directing polarized light through the film and detecting the polarization of the light through the film. Specifically, the film may be rotated about an axis perpendicular to the film and the polarization of the light may be detected by observing the changes in phase (light to dark transitions) at locations within the unit cells defined by the system, for instance, by a phase-locking mechanism of the system.

It is important to note, because of the nature of this system, all effects occur in the absence of steady external magnetic fields. The domains are all stable and therefore registration of digital information as for example cylinder domains is substantially permanent subject to the process modifications herein taught. The energy density to photomagnetically induce cylinder domain magnetization is on the order of about $3 \times 10^{11}$ watts per meter$^2$ in the film. A one-half watt CW laser with 50 percent transmission through an optical beam splitter and focused to diffraction limits is easily capable of generating controlled cylinder domains capable of inversion in thin film ferrimagnetic material, assuming appropriate negative defocusing of the laser beam.

The invention has now been explained with reference to specific embodiments. Other embodiments will be apparent to those ordinary skill in the art. It is therefore not intended that this invention be limited, except as indicated by the appended claims.

What is claimed is:

1. A method for transforming ferrimagnetic material comprising:
   transiently exposing ferrimagnetic thin film with circularly polarized optical radiation of a concentration, power intensity and duration sufficient to induce a change in intrinsic magnetization but not sufficient to cause irreversible change to said material.

2. A method for inducing repeatable transformation in ferrimagnetic thin film material as change in transmission characteristics of polarized light comprising:
   transiently exposing a target domain of a ferrimagnetic film of a thickness on the order of twice the width of a natural domain of said film to a circularly polarized beam of coherent optical radiation, said beam being of a diameter less than the width of said target domain and said exposing being of an intensity and duration sufficient to induce a change in intrinsic magnetization of said domain according to the circular polarization of said beam, and insufficient to cause irreversible destruction to said domain.

3. The method according to claim 2 wherein said target domain is a cylinder and wherein said beam is of a polarization to induce an inversion in magnetization of said cylinder domain.

4. The method according to claim 2 or 3 wherein said beam is focused to its diffraction limit and wherein said beam is directed to intersect said film in a beam region between its diffraction-limited focal plane and a point of phase transition of pi of said beam characterizing a selected negative defocusing of said polarized beam.

5. The method according to claim 2 or 3 wherein said beam is directed at said film with a modulated intensity between zero and a peak below 100 percent of the intensity sufficient to cause irreversible damage to said film.

6. The method according to claim 5 wherein said beam intensity is modulated by moving said beam relative to said film.

7. A method for inducing electron spin reversal in selected domains in a ferrimagnetic material comprising:
   exposing a target stripe domain of a ferrimagnetic film to a circularly polarized coherent optical radiation beam, said beam being oppositely polarized relative to inherent magnetization of said target stripe domain, said beam being of a diameter less than the width of said target stripe domain of said film, said beam being directed through said film for an interval insufficient to cause irreversible damage to said target cylinder domain but sufficient to impart angular momentum to reverse electron spin in said ferrimagnetic material in order to generate a cylinder domain and a surrounding toroid domain of a magnetization different from the magnetization of said original stripe domain.

8. The method according to claim 7 wherein said beam is defocused below its diffraction limits and wherein said beam is directed to intersect said film in a beam region between its diffraction-limited focal plane and a point of phase transition of pi of said beam.

9. The method according to claim 8 wherein said beam is directed to intersect said film in negative phase space of said beam between said film and a source of said beam.

10. The method according to claim 7 wherein said beam is directed at said film with a modulated intensity between zero and a peak below 100 percent of the intensity sufficient to cause irreversible damage to said film.

11. The method according to claim 10 wherein said beam intensity is modulated by moving said beam relative to said film at high velocity limited by the characteristic angular precession frequency of said material.

12. A method for creating an observable domain change in magnetic domain thin film material comprising directing a beam of near diffraction-limited circularly polarized optical radiation at a domain of a ferrimagnetic film with an intensity sufficient to induce a change in observable polarization of optical radiation through said film, and for an interval insufficient to cause irreversible damage to said domain.

13. The method according to claim 12 wherein said beam is moved relative to said film at high velocity.

14. The method according to claim 12 wherein said beam is operative to heat said film to the Curie temperature of said film in order to thermomagnetically erase photomagnetically induced magnetization of said material.

15. The method according to claim 12 further including the steps of:
provid ing longitudinal boundaries in said film having a distance between boundaries on the order of twice the width of a natural stripe domain of said film; and
directing said beam of optical radiation orthogonally to said boundaries in order to generate a pattern of stripe domains orthogonal to said longitudinal boundaries thereby to define a unit cell of a size on the order of about the one pair of stripe domains on a side width and length and one stripe domain in depth.

16. A method for detecting a condition of selected domains in ferrimagnetic thin film material comprising:
directing coherent, circularly polarized illumination to said material;
detecting polarization of radiation through said domains at selected locations; and
phase-locking to a selected polarization.

17. The method according to claim 16 further including the step of detecting a change in phase in said polarization.

18. A method for photomagnetically storing, altering and retrieving data in a thin film of ferrimagnetic material comprising:
providing cylinder and toroid domains in pairs in said thin film at preselected locations, said cylinder domains of a first intrinsic magnetization representing a first discrete state and said cylinder domains of a second intrinsic magnetization representing a second discrete state; and
detecting the polarization of optical radiation directed through said preselected locations.

19. The method according to claim 18 further including the step of providing stripe domains in pairs at preselected locations in said film, said magnetization and orientation of a selected one of said stripe domain pairs representing a third discrete state.

20. The method according to claim 19 wherein said stripe domain providing step comprises thermomagnetically inducing an electron spin orientation or domain translation at said selected locations.

21. The method according to claim 19 further including the step of changing said stripe domain pairs at selected locations to a preselected cylinder and toroid domain pairs with said cylinder domains of said first magnetization or of said second magnetization by photomagnetically inducing an electron spin reversal with circularly polarized radiation.

22. The method according to claim 18 further including the step of altering the magnetization of a selected cylinder domain and thereby surrounding toroid domain by photomagnetically inducing an electron spin inversion with circularly polarized radiation of a polarization opposing intrinsic magnetization of said selected cylinder domain.

23. The method according to claim 18 further including the step of changing intrinsic magnetization of selected cylinder domain and associated toroid domain to a stripe domain pair by directing diffraction-limited focused radiation at said cylinder domain to heat said cylinder domain to its Curie temperature in order to cause said cylinder domain and toroid domain pair to change to a striped domain pair.

24. The method of any one of claims 18-23 comprising the step of providing means for rotating said film on an axis perpendicular to said film at high linear velocity limited by a characteristic precession frequency of said material; and
detecting the polarization of optical radiation directed through said film.

25. An apparatus for storing, modifying and retrieving digital data in a thin film ferrimagnetic material comprising:
means for providing circularly polarized coherent optical radiation;
means for directing said circularly polarized optical radiation at locations in said thin film material with sufficient intensity to effect a change in intrinsic magnetization of said material at said locations; and
means for observing polarization of optical radiation through said thin film.

26. An apparatus according to claim 25 further including means for focusing said circularly polarized optical radiation below diffraction limits at a focal plane adjacent the surface of said film.

27. The apparatus according to claim 26 wherein said thin film material is interposed between said focusing means and said focal plane.

28. An apparatus according to claim 25 further including means for moving said film relative to said optical radiation, said optical radiation being limited in beam width to the order of the width of a domain of said film.

29. The apparatus according to claim 28 wherein said moving means includes means for rotating said film about an axis at a linear velocity limited by a characteristic precession frequency of said material.

30. A photomagnetic mass memory system comprising:
an alterable quantum-mechanical optical data storage and retrieval medium reversibly responsive to photomagnetic electron spin orientation;
means for effecting photomagnetic electron spin reversal in said medium;
means for detecting electron spin orientation in said medium; and
wherein said effecting means comprises means for generating circularly polarized coherent optical radiation.

31. The system according to claim 30 wherein said medium is a ferrimagnetic thin film on a substrate capable of sustaining cylinder and toroid domain pairs in the absence of a steady external magnetic field.

32. The system according to claim 30 wherein said detecting means comprises means for detecting polarization of optical radiation directed through said medium.

33. The system according to claim 32 wherein said detecting means further includes means for phase-locking to said photomagnetically induced magnetization.

34. The system according to claim 30 wherein said effecting means includes means for modulating optical radiation.

35. The system according to claim 34 further including means for moving said medium at high transport velocity relative to said effecting means.

36. The system according to claim 35 further including means for prealigning domains of said medium orthogonally to a primary circular direction of motion of said medium.

37. The system according to claim 35 further including means for thermomagnetically erasing cylinder domain and toroid domain pairs from selected locations of said medium.

38. The system according to claim 30 wherein said detecting means includes means utilizing a dual path Faraday effect for detecting polarization of optical radiation through said thin film.

39. The system according to claim 38 for photomagnetically erasing a cylinder domain and its surrounding toroid domain comprising means for providing a polarized coherent optical radiation beam of a circular polarization of a sense opposing the polarization of said generating means for inverting intrinsic magnetization of said cylinder domain and its surrounding toroid domain.

* * * * *